United States Patent [19]

Lüscher

[11] 3,956,714
[45] May 11, 1976

[54] ENERGIZING CIRCUIT WITH INSULATED-GATE FIELD-EFFECT TRANSISTORS FOR CRYSTAL OSCILLATOR

[75] Inventor: Jakob Lüscher, Carouge, Switzerland

[73] Assignee: Battelle Memorial Institute, Carouge, Switzerland

[22] Filed: Apr. 1, 1975

[21] Appl. No.: 564,061

[30] Foreign Application Priority Data
Apr. 1, 1974  Switzerland.......................... 4504/74

[52] U.S. Cl.............................. 331/116 R; 58/23 A; 331/108 D
[51] Int. Cl.²......................................... H03B 5/36
[58] Field of Search............ 331/116 R, 159, 108 D; 58/23 R, 23 A, 23 AC

[56] References Cited
UNITED STATES PATENTS

| | | | |
|---|---|---|---|
| 3,585,527 | 6/1971 | Luscher | 331/116 R |
| 3,829,795 | 8/1974 | Minney | 331/116 R |
| 3,890,580 | 6/1975 | Kuhn et al. | 331/116 R |

Primary Examiner—Siegfried H. Grimm
Attorney, Agent, or Firm—Karl F. Ross; Herbert Dubno

[57] ABSTRACT

A piezoelectric crystal has an energizing circuit including a low-voltage supply battery connected across two parallel pairs of series-connected field-effect transistors of the insulated-gate type, the junction of each FET pair being tied to a tap of a respective capacitive voltage divider which lies between a reference pole of the battery and a respective terminal of a piezoelectric crystal. Each of these crystal terminals is also connected directly to the gate of the first FET of a respective pair and via a coupling capacitor to the gate of the second FET of the opposite pair, the last-mentioned gate being biased with a potential outside the voltage range of the supply battery. In an integrated module, the reference terminal may be a heteropolar enclave of a substrate capacitively separated from actual ground, the biasing potentials for the gates of the several FETs in the energizing circuit being derived from an ancillary network which lies between the reference pole and ground and which includes ancillary FETs shunting the inter-gate coupling capacitors.

10 Claims, 10 Drawing Figures

ENERGIZING CIRCUIT WITH INSULATED-GATE FIELD-EFFECT TRANSISTORS FOR CRYSTAL OSCILLATOR

FIELD OF THE INVENTION

My present invention relates to an oscillatory system, employing a piezoelectric crystal as a resonator, and more particularly to an energizing circuit for such a resonator.

BACKGROUND OF THE INVENTION

In my prior U.S. Pat. No. 3,585,527 I have disclosed a system of this character wherein oscillations of a quartz crystal are sustained by an energizing circuit including a pair of field-effect transistors of the MOS/FET type, the first MOS/FET having an insulated gate connected to a terminal of the crystal whereas the insulated gate of the second MOS/FET is fixedly biased by a resistive voltage divider bridged across a supply battery. A biasing resistor for the gate of the first MOS/FET is connected across the battery in series with a capacitive voltage divider shunting the crystal, a tap of the latter divider being tied to a junction between the source of the first and the drain of the second MOS/FET. Only the first transistor constitutes an electronic switch serving as an active element of what is essentially a Colpitts oscillator; the second transistor only controls the current supplied to the switching MOS/FET.

The continuously conducting second transistor of my prior system consumes about half the energy supplied by the battery, the power dissipated therein being given by the product of its mean drain voltage and its current. The overall efficiency of that system is on the order of 0.3, with an upper limit of about 0.4.

OBJECTS OF THE INVENTION

The general object of my present invention is to provide an improved oscillatory system of the character described in my prior patent, operating at an increased efficiency on the order of 0.8.

Another object is to provide a system of this nature which can be conveniently realized by integrated-circuit technique as a unitary module.

SUMMARY OF THE INVENTION

In accordance with my present invention, a series FET pair such as the MOS/FETs of my prior patent is formed by two insulated-gate field-effect transistors (IGFETs) both acting as active electronic switches. For this purpose, the gate of each IGFET is connected to a respective terminal of the piezoelectric crystal, either directly or via a coupling capacitor. The gate of the first IGFET is provided with first biasing means supplying thereto a potential within the voltage range encompassed by the potentials of the two poles of the associated direct-current supply (referred to hereinafter as a battery); the gate of the second IGFET is provided with second biasing means for supplying thereto a potential outside that voltage range. The coupling capacitor may form part of another voltage divider including a further capacitor inserted between the gate of the second IGFET and one of the poles of the battery which will be referred to as the reference pole; the other battery pole, connected to the drain of the first IGFET, will be referred to hereinafter as the working pole.

According to a more particular feature of my present invention, the circuit arrangement just described is symmetrically duplicated on opposite sides of the crystal resonator so that the system includes two series IGFET pairs connected across the battery, the source/drain junction of each IGFET pair being tied to a tap of a respective capacitive voltage divider inserted between the gate of its first transistor and the source of its second transistor; the latter is again tied to the reference pole of the battery.

In order to obviate the need for a separate source of biasing potential, and to eliminate the biasing resistances otherwise required, another feature of my invention involves the provision of an ancillary biasing network in the symmetrical system last described, the network being inserted between the reference pole of the battery and a ground lead which is capacitively coupled to that reference pole. Such an ancillary network may include transistor means, preferably also of the MOS/FET type, shunting the coupling capacitor between the first gate of one IGFET pair and the second gate of the other IGFET pair whereby the second gate of each IGFET pair can be intermittently connected to a point of intermediate potential between ground and the reference level. A system of this description, composed exclusively of capacitors and MOS/FETs, can be readily incorporated in an integrated-circuit module, e.g. for use as a time base in an electronic clockwork. Its symmetrical arrangement facilitates the choice of circuit parameters insuring a high degree of frequency stability, as required for chronometric purposes. Less stringent demands regarding constancy of frequency exist in a direct-current converter in which the oscillator output is subsequently rectified; the high degree of efficiency of the present system makes it also eminently suitable for use in such a converter.

BRIEF DESCRIPTION OF THE DRAWING

The above and other features of my invention will now be described in greater detail with reference to the accompanying drawing in which.

SPECIFIC DESCRIPTION

Figure 1:
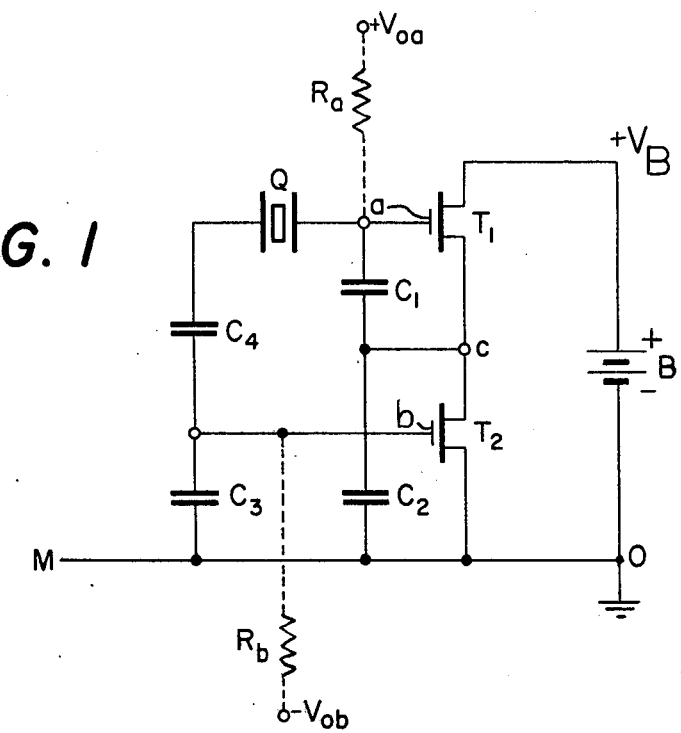
FIG. 1 is a circuit diagram of a simple embodiment of my invention.

In FIG. 1 I have shown a battery B serving as a direct-current supply for a pair of series-connected MOS/FETs $T_1$ and $T_2$. The negative terminal of the battery, serving as a reference pole, is at zero potential (ground) and is connected to a reference bus bar M which is tied to the source of MOS/FET $T_2$. The positive working pole of the battery is tied to the drain of MOS/FET $T_1$ whose source forms a junction $c$ with the drain of MOS/FET $T_2$. The insulated gate $a$ of MOS/FET $T_1$ is connected on the one hand to a source of positive biasing potential $+V_{oa}$, by way of a high-ohmic resistor $R_a$, and on the other hand to the right-hand terminal of a quartz crystal Q whose left-hand terminal is coupled to bus bar M via a capacitive voltage divider comprising a pair of series condensers $C_3$ and $C_4$. A tap of voltage divider $C_3$, $C_4$ is tied to the gate $b$ of MOS/FET $I_2$ and is also connected, via a high-ohmic resistor $R_b$, to a source of biasing potential $-V_{ob}$. Junction $c$ is tied to a tap of another capacitive voltage divider, consisting of two series condensers $C_1$ and $C_2$, connected between gate $a$ and bus bar M.

Biasing potential $+V_{oa}$ lies in a voltage range defined by supply potentials O and $+V_B$ whereas biasing potential $-V_{ob}$ is outside that voltage range. Thus, potential $+V_{oa}$ can be readily derived from a resistive voltage divider bridged across battery B; a separate voltage source, however, will be needed for potential $-V_{ob}$.

The efficiency $\eta$ of a crystal-controlled oscillator can be defined as $$\eta = \frac{P_t}{P_e} \qquad 1$$

where $P_t$ represents the total output energy and $P_e$ is the supply energy, with $$P_t = P_R + P_L \qquad 2$$

where $P_R$ is the energy dissipated in the crystal and $P_L$ is the energy consumed in a load circuit connected thereacross. Thus, $$P_e = P_R + P_L + P_o \qquad 3$$

where $P_o$ is the energy consumption in the supply circuit.

The circuit arrangement shown in FIG. 1 is designed to minimize the magnitude of this latter term $P_o$ in order to provide a high degree of efficiency according to the relationship $$\eta = \frac{P_R + P_L}{P_R + P_L + P_o} \qquad 4$$

derived from the foregoing equations (1) – (3).

The quartz crystal Q of FIG. 1 may have a natural frequency of several MHz. The field-effect transistors $T_1$ and $T_2$ may be constituted by zones of negative conductivity type $N^+$ integrated in a crystalline substrate of conductivity type P as disclosed in my commonly owned prior U.S. Pat. No. 3,845,331.

Figure 2:
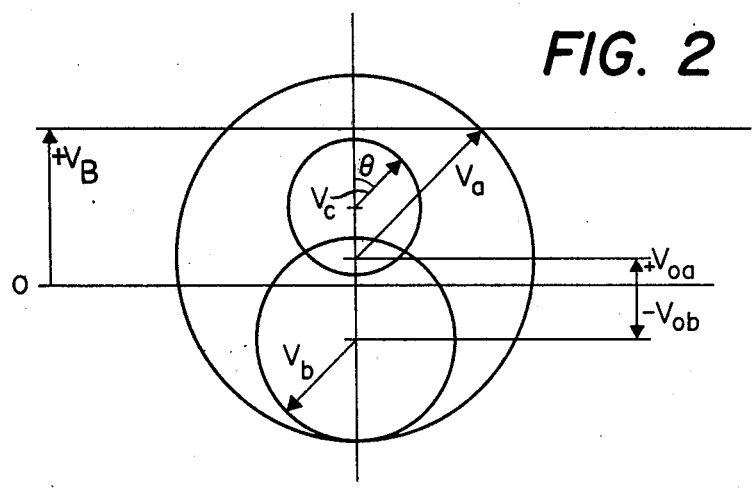
FIG. 2 is a vector diagram relating to the operation of the system of FIG. 1.

In FIG. 2 I have indicated the gate voltage $V_a$ of MOS/FET $T_1$, the gate voltage $V_b$ of MOS/FET $T_2$ and the junction voltage $V_c$ developed between the two transistors at a point in a cycle preceding by a predetermined phase angle $\theta$ the point where the gate voltages $V_a$ and $V_b$ reach a positive and a negative peak, respectively, the potential $V_a + V_{oa}$ of gate $a$ being equal to the battery voltage $+V_b$ at this instant. FIG. 2 also shows the relative magnitudes of voltages $V_B$, $V_{oa}$ and $V_{ob}$. With voltages $V_a$ and $V_B$ in mutual phase opposition, transistors $T_1$ and $T_2$ conduct alternately whenever the potential difference between points $a$ and $c$ (in the case of MOS/FET $T_1$) or between points $b$ and O (in the case of MOS/FET $T_2$) exceeds the threshold voltage of the respective transistor. Maximum current flow coincides with minimum source/drain voltage of the conductive transistor so that energy dissipation is low. Since conduction of either transistor coincides with a cutoff of the other transistor, no closed direct-current path exists at any time in series with battery B.

A nonillustrated load may be connected between bus bar M and any of points $a$, $b$, and $c$, the amplitude of the output oscillation being different in each instance.

Figure 3:
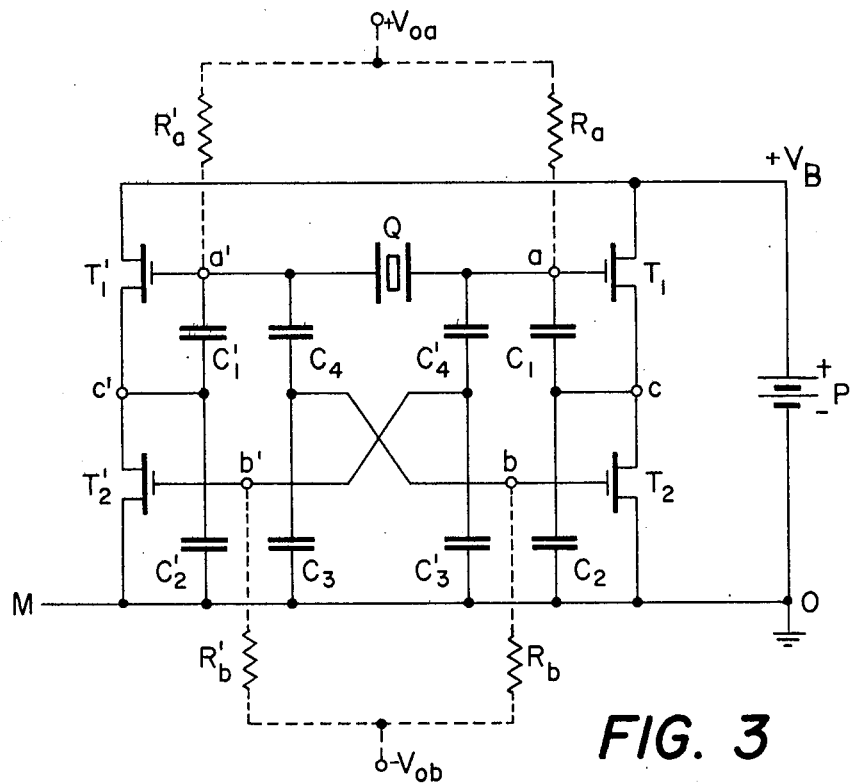
FIG. 3 is a circuit diagram similar to FIG. 1, illustrating a symmetrical modification of the system.

In FIG. 3 I have shown a modification of the system of FIG. 1 in which the circuits described above are symmetrically duplicated; the symmetrical counterparts of the components shown in FIG. 1 have been designated by the same reference characters supplemented by a prime mark ('). Thus, the system of FIG. 3 includes a second pair of series MOS/FETs $T_1'$, $T_2'$, forming a junction $c'$, and two further capacitive voltage dividers $C_1'$, $C_2'$ and $C_3'$, $C_4'$ as well as biasing resistors $R_a'$, $R_b'$. The gates $a$, $a'$ of the first transistors $T_1$, $T_1'$ of the two pairs are cross-connected to the gates $b'$, $b$ of the respectively opposite second transistors $T_2'$, $T_2$ via coupling capacitors $C_4'$ and $C_4$ forming part of two of these voltage dividers.

The total energy $P_t$, represented above by equation (2), can also be defined by $$R_p = \frac{2V_a^2}{P_t} \qquad 5$$

where $V_a$ is the amplitude of the voltage swing (at points $a$, $a'$) in each half of the system and the resistance $R_p$ is given by $$\frac{1}{R_p} = \frac{1}{R_{PQ}} + \frac{1}{R_L} \qquad 6$$

with $R_L$ representing the load resistance connected across the crystal Q and $$R_{PQ} = \frac{1}{\omega^2 \cdot (C_o + C_T)^2 \cdot R_S} \qquad 7$$

constituting the shunt resistance of that crystal; $C_o$ is the static capacitance of the crystal, $C_T$ is the circuit capacitance in parallel with the crystal, $\omega$ is the pulsatance and $R_S$ is the equivalent series resistance of the crystal.

An equivalent phase resistance $R_{PP}$, appearing between bus bar M and point $a$ or $a'$, is given by $$R_{PP} = \frac{R_p}{2} \qquad 8$$

The corresponding equivalent resistance between bus bar M and point $c$ or $c'$ can then be expressed by $$R_c = \left[\frac{C_1}{C_1 + C_2}\right]^2 \cdot R_{PP} \qquad 9$$

Figure 4:
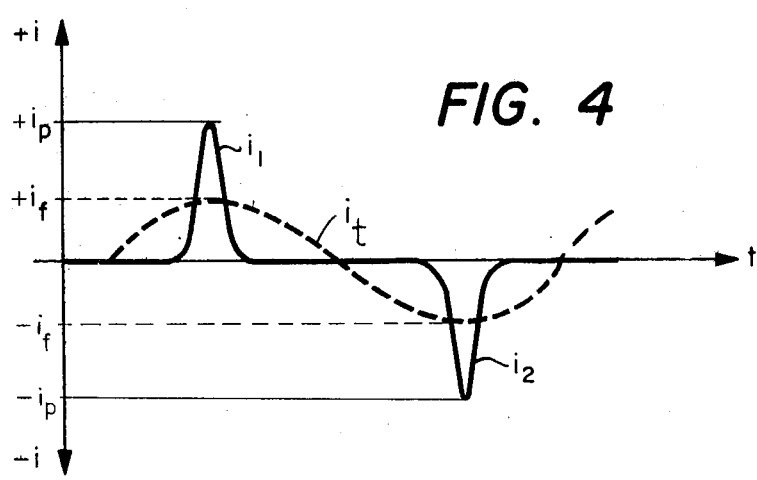
FIG. 4 is a wave diagram relating to the system of FIG. 3.

If we assume that all the MOS/FETs are substantially identical, we can represent the current flow through transistors $T_1$, $T_1'$ by a positive pulse $i_1$ and the current flow through transistors $T_2$, $T_2'$ by a negative pulse $i_2$ as shown in FIG. 4. The fundamental frequency of pulse train $i_1$, $i_2$, obtained by Fourier analysis, is a current wave $i_t$ whose amplitude $+i_f$ is less than the peak amplitude $+i_p$ of the pulses. The current $i_t$ is in phase with voltage $V_c$ (see FIG. 2); each transistor, carrying one-fourth of the load current, may be regarded as working into an equivalent load resistance $$R_c' = 2R_c \qquad (10)$$

Figure 5:
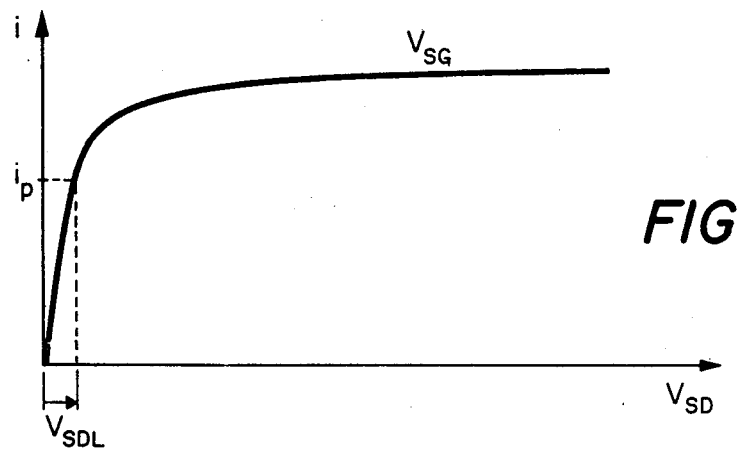
FIG. 5 is an explanatory graph pertaining to the operation of the system of FIG. 3.

The graph of FIG. 5 shows a typical current/voltage characteristic for a MOS/FET whose source/drain voltage $V_{SD}$ assumes a minimum value $V_{SDL}$ when the current $i$ therethrough reaches a value $i_p$.

Voltage $V_c$ may be expressed by $$V_c = R_c' \cdot \frac{i_t}{2} \qquad (11)$$

with $\frac{i_t}{2} = i_p \cdot f(\theta) \qquad (12)$ where $f(\theta)$ is a function of the phase angle $\theta$ which depends on the characteristic of the transistor and can be determined by the Fourier analysis yielding the fundamental wave $i_t$ of FIG. 4. From equations (11) and (12) we obtain $$\frac{V_c}{R_c'} = i_p \cdot f(\theta) \qquad (13)$$

A limiting internal resistance $R_{iL}$ can be defined as follows:

$$R_{iL} = \frac{V_{SDL}}{i_p}$$

For high efficiency it is advantageous to choose a very low value of limiting voltage $V_{SDL}$, generally several tenths of a volt. The maximum amplitude of the voltage $V_c$ is then given by $$\frac{V_B}{2} - V_{SDL} = V_c \qquad (15)$$

Furthermore, $$\frac{V_c}{R_c'} = \frac{V_{SDL}}{R_{iL}} \cdot f(\theta) \qquad (16)$$

whence, from equations (15) and (16), $$V_c = \frac{\frac{1}{2} V_B \cdot \frac{R_c'}{R_{iL}}}{\frac{R_c'}{R_{iL}} + \frac{1}{f(\theta)}} \qquad (17)$$

With capacitors $C_1$ and $C_2$ acting as a voltage divider, the relationship of voltages $V_a$ and $V_c$ is given by $$V_a = \left[1 + \frac{C_2}{C_1}\right] \cdot V_c \qquad (18)$$

whence, in view of equation (17), $$V_a = \frac{1}{2} \left[1 + \frac{C_2}{C_1}\right] V_B \cdot \frac{\frac{R_c'}{R_{iL}}}{\frac{R_c'}{R_{iL}} + \frac{1}{f(\theta)}} \qquad (19)$$

For optimum performance it is desirable that the amplitude of voltage $V_c$ be so chosen as to limit the current flow to just the magnitude required for saturating the transistors; thus, as indicated in FIGS. 4 and 5, the current peak $i_p$ substantially equals the current corresponding to the minimum voltage drop $V_{SDL}$ across the MOS/FET channel. This is particularly desirable in the case of chronometric circuits calling for a highly stable oscillating frequency. Such a limitation of the current flow avoids overexcitation of the oscillator which, as is well known, tends to reduce its frequency stability.

Lowering the phase angle $\theta$ also increases the operating efficiency. If the supply current for the oscillator is given by $$i_o = 2 \cdot i_p \cdot \phi(\theta) \qquad (20)$$

with $\phi(\theta)$ an angle function analogous to $f(\theta)$, obtained by Fourier analysis, we can write $$i_o = \frac{2 V_{SDL}}{R_{iL}} \cdot \phi(\theta) \qquad (21)$$

From equations (15), (17) and (21) we obtain $$i_o = V_B \cdot \left[1 - \frac{\frac{R_c'}{R_{iL}}}{\frac{R_c'}{R_{iL}} + \frac{1}{f(\theta)}}\right] \cdot \frac{\phi(\theta)}{R_{iL}} \qquad (22)$$

whence the supply energy $$p_c = i_o V_B = V_B^2 \cdot \left[1 - \frac{\frac{R_c'}{R_{iL}}}{\frac{R_c'}{R_{iL}} + \frac{1}{f(\theta)}}\right] \cdot \frac{\phi(\theta)}{R_{iL}} \qquad (23)$$

The total output energy $p_t$ is then given by $$p_t = \frac{2V_c^2}{R_c'} \qquad (24)$$

Now, from equations (1), (17), (23) and (24), we find the following expression for the overall efficiency $\eta$:

$$\eta = \frac{1}{2} \cdot \frac{f(\theta)}{\phi(\theta)} \cdot \frac{\frac{R_c'}{R_{iL}}}{\frac{R_c'}{R_{iL}} + \frac{1}{f(\theta)}} \qquad (25)$$

With $\theta = 40°$, for example, and with a square-law transistor characteristic, we find $f(\theta) = 0.22$ and $f(\theta)/\phi(\theta) = 1.95$. With these values it is easy to obtain a sufficiently high ratio $R_c'/R_{iL}$ to realize an efficiency on the order of 80% and up.

Figure 6:
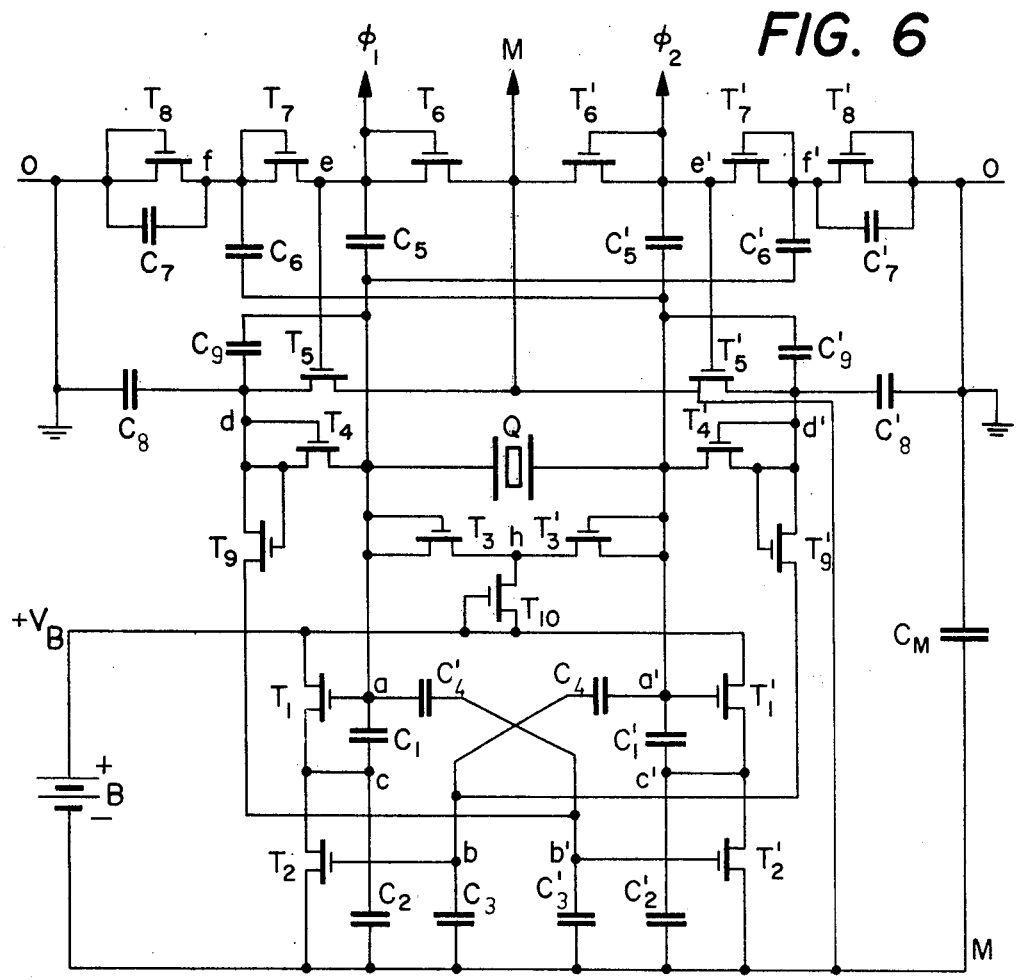
FIG. 6 is a circuit diagram illustrating a more elaborate system of the symmetrical type according to my invention.

In FIG. 6 I have shown a circuit arrangement generally similar to that of FIG. 3 wherein, however, the biasing sources $+V_{oa}$ and $-V_{ob}$ with their resistors $R_a$, $R_a'$, $R_b$ and $R_b'$ have been eliminated. Bus bar M is here separated from the ground lead O to which it is capacitively coupled as indicated at $C_M$; in an integrated circuit of the type described and shown in my prior U.S. Pat. No. 3,845,331, bus bar M may be represented by an enclave of a conductivity type (e.g. $N^+$) different from that of its substrate. The energizing circuit for crystal Q has the same basic structure as in FIG. 3, except that the working pole $+V_B$ of battery B is now connected through a MOS/FET $T_{10}$ to a point $h$ from which two circuit branches, including MOS/FETS $T_3$ and $T_3'$, respectively extend to gates $a$ and $a'$ of MOS/FETs $T_1$ and $T_1'$. Two further MOS/FETs $T_4$ and $T_9$, with a junction $d$, are serially connected between gates $a$ and $b'$ in shunt with capacitor $C_4'$; in an identical manner, two MOS/FETs $T_4'$ and $T_9'$ form a junction $d'$ and are connected in parallel with capacitor $C_4$ between gates $a'$ and $b$. These additional MOS/FETs form part of an ancillary biasing network connected between the negative reference pole of battery B, i.e. bus bar M, and ground at O. The two halves of that network comprise respective series MOS/FETs $T_6$, $T_7$ and $T_8$, forming junctions $e$ and $f$ between them, on one side of crystal Q and MOS/FETs $T_6'$, $T_7'$, $T_8'$ with junctions $e'$ and $f'$ on the opposite side. Points $d$ and $d'$ are connected to ground O through respective capacitors $C_8$, $C_8'$, to junctions $e$, $e'$ on their respective sides of the network via series capacitors $C_5$, $C_9$ and $C_5'$, $C_9'$ having junctions tied to points $a$, $a'$, and to junctions $f'$ and $f$ on the respectively opposite sides of the network via capacitors $C_6'$, $C_6$ in series with capacitors $C_9$, $C_9'$, respectively. Transistors $T_8$ and $T_8'$ are shunted by respective capacitors $C_7$ and $C_7'$.

Figure 7:
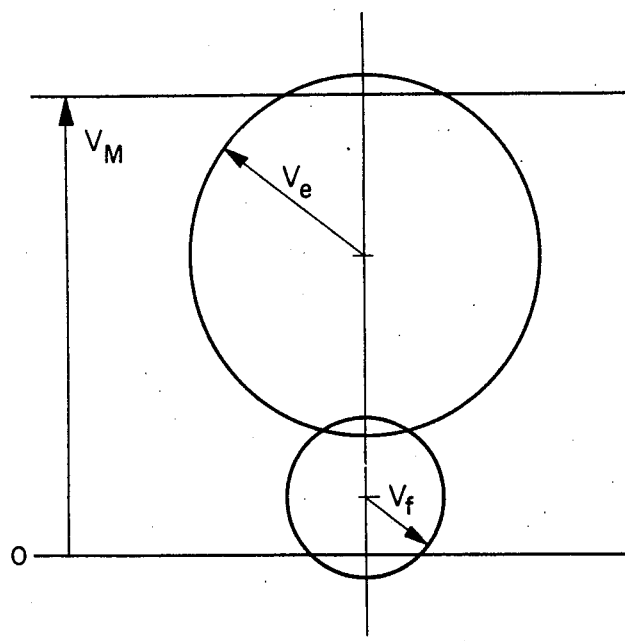
FIG. 7 is a vector diagram relating to the system of FIG. 6.

The vector diagram of FIG. 7 shows the alternating voltages $V_e$ and $V_f$ of points $e$ (or $e'$) and $f$ (or $f$), which are in mutual phase opposition, with reference to the constant voltage difference $V_M$ between bus bar M and ground. Voltage $V_e$ also represents the output oscillation of the system developed across a pair of terminals $\phi_1$, $\phi_2$ which are respectively connected to points $e$ and $e'$.

Transistor chains $P_6 - P_8$ and $P_6' - P_8'$ may have a structure similar to that of the MOS/FETs shown in my prior U.S. Pat. No. 3,845,331.

The relative magnitudes of voltages $V_f$ and $V_a'$ (or $V_f'$ and $V_a$) are given by the relationship $$V_f = V_a' \cdot \frac{C_6}{C_6 + C_7} \qquad 26$$

whereas the relationship between voltages $V_d$ and $V_a$ (or $V_d'$ and $V_a'$) is given by $$V_d = V_a \cdot \frac{C_9}{C_8 + C_9} \qquad 27$$

Figure 9A:
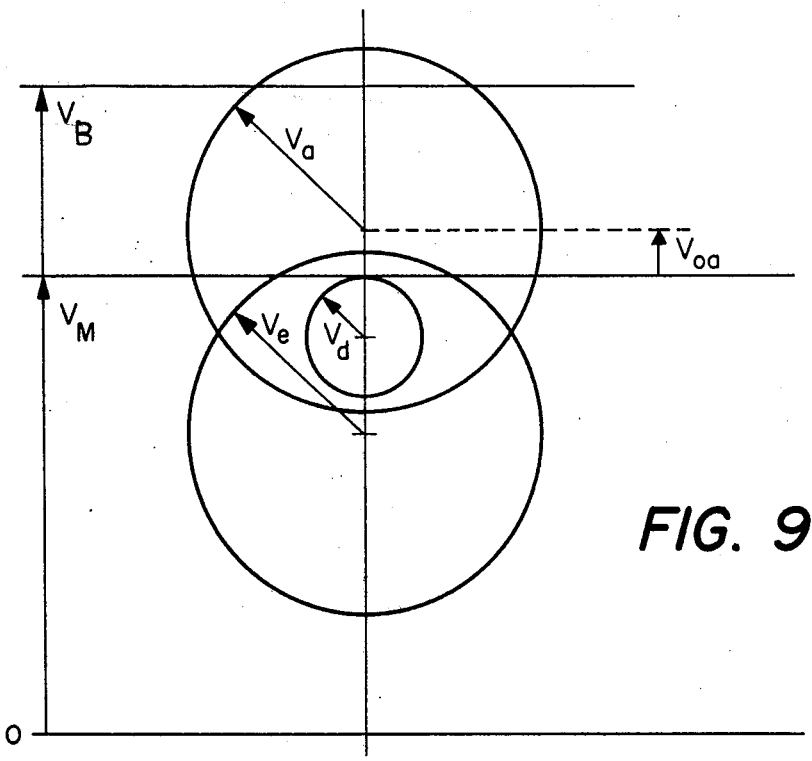
FIGS. 9a and 9b are vector diagrams relating to the system of FIGS. 6 and 8.
Figure 9B:
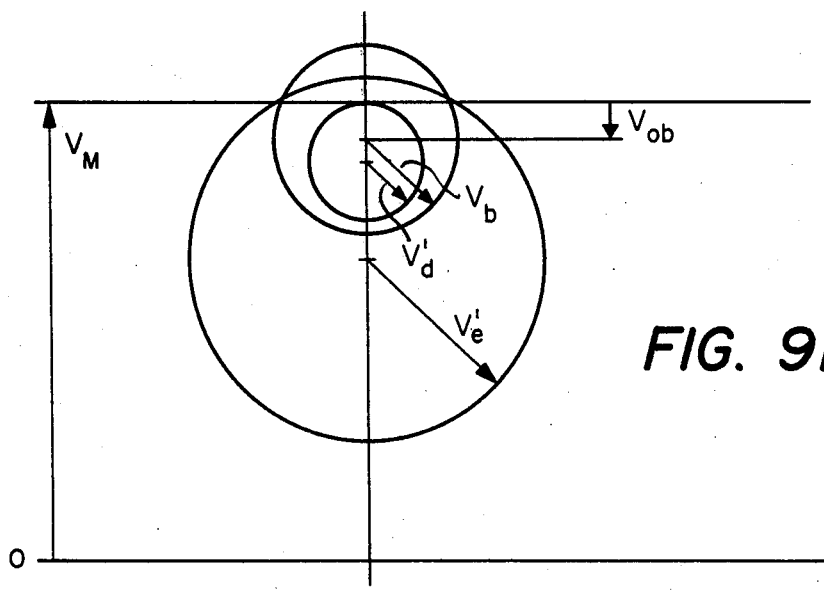

If transistors $T_5$, $T_5'$ and $T_6$, $T_6'$ have the same threshold voltages, then the highest possible voltage value of $V_d$ will be substantially equal to $V_M$ as is apparent from FIG. 9a, provided that voltage $V_d$ is smaller than voltage $V_e$ and in phase therewith. The voltage difference between point $a$ or $a'$ and reference pole M will then have a negative maximum equal to $-(2V_d + V_{T4})$ where $V_{T4}$ is the threshold voltage of transistor $T_4$ under the existing biasing conditions. The biasing voltage $V_{oa}$ for transistor $T_1$ or $T_1'$ is then given by $$V_{oa} = -(2V_d + V_{T4}) + V_a \qquad 28$$

according to FIG. 9a, whereas the corresponding biasing voltage $V_{ob}$ for transistor $T_2$ or $T_2'$ is expressed by $$V_{ob} = -(2V_d' - V_{T9}') + V_b \qquad 29$$

as will be apparent from FIG. 9b.

Figure 8:
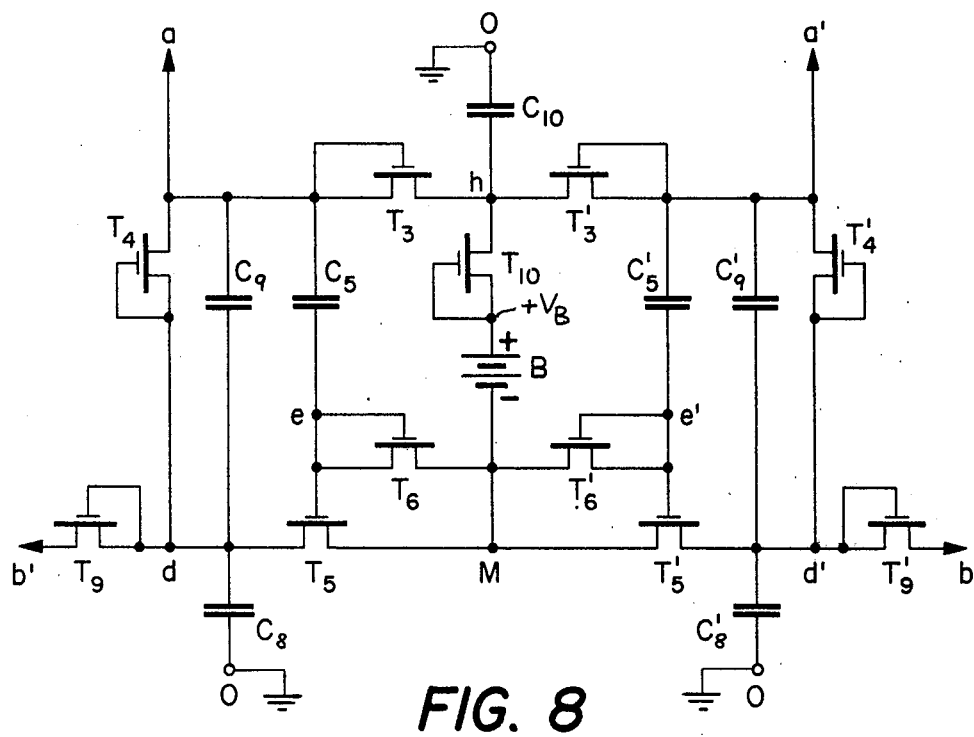
FIG. 8 is a more detailed circuit diagram showing some of the elements of FIG. 6.

Transistors $T_3$, $T_3'$ and $T_{10}$, with their common junction $h$ grounded through a capacitor $C_{10}$ as shown in FIG. 8, are designed to facilitate the starting of the oscillator.

As is well known, the doping of a semiconductor in an integrated circuit and the material of a layer constituting an insulated gate electrode for a field-effect transistor can be so chosen that the transistor conducts slightly even if no control voltage is applied to it and if its source is not or only very slightly biased with reference to the substrate, whereas with a higher bias such a transistor will be blocked. The threshold voltage of the transistor thus changes from a negative value to a positive value with rising biasing voltage for the source.

Upon the starting of the oscillator (i.e. when the battery B is connected in circuit), transistors $T_3$, $T_4$, $T_5$ and $T_{10}$ form therewith a closed direct-current circuit which biases the gates $a$ and $a'$ as well as $b$ and $b'$ positively with reference to bus bar M. Transistors $T_1$, $T_1'$ and $T_2$, $T_2'$ can be readily designed to have a sufficiently high gain for starting up the oscillations. When the voltage amplitude at point $a$ (or $a'$) reaches the value $V_a$ indicated in FIG. 9a, the potential $V_h$ at point $h$ with reference to bus bar M becomes $$V_h = V_{oa} + V_a - V_{T3} \qquad 30$$

wherein $V_{T3}$ represents the threshold voltage of transistor $T_3$.

With voltage $V_h$ exceeding the battery voltage $+V_B$, transistor $T_{10}$ is blocked. It can be shown mathematically that the energizing circuit operates at maximum efficiency if, on the one hand, each transistor is traversed by the same alternating current and, on the other hand, the ratio of the amplitude of the fundamental current wave to the d-c component is the same for all four transistors. It can also be shown that this latter requirement is satisfied only if the phase angles $\theta$ are identical.

In the system of FIG. 6, in which the biasing voltages for transistors $T_1$, $T_2$ or $T_1'$, $T_2'$ are derived from the same point $d$ or $d'$, the gate voltage $V_b$ of transistor $T_2$ or $T_2'$ must satisfy the relationship $$V_b = \frac{2 V_d + V_{T2} + V_{T9}'}{1 + \cos\theta} \qquad 31$$

where $$\cos\theta = 1 - \frac{V_{SC1}}{V_a} \cdot \left[\frac{C_1}{C_2} + 1\right] \qquad 32$$

It is known that, generally, the amplitude of an oscillator is limited by the fact that the mean gain of its active switching element or elements diminishes with increasing amplitude above a certain level. In the present instance, such a diminution of the mean gain will result from an overexcitation of the switching MOS/FETs $T_1$, $T_2$, $T_1'$, $T_2'$, from an increase of their respective threshold voltages and/or from a reduction of phase angle $\theta$. If the output amplitude of the oscillator rises, reference voltage $V_M$ also increases and with it the positive threshold voltages of the switching transistors. If the oscillator must have a high frequency stability, as required in chronometric circuits, such an overexcitation of the switching transistor is to be avoided. For this purpose it is necessary that the source/gate voltage $V_{SG}$ of any transistor, which must exceed its threshold voltage, should not be substantially greater than the voltage $V_{SDL}$ discussed in connection with FIG. 5. It will then be desirable to omit the transistor $T_{10}$ and to connect the point $h$ directly to positive battery voltage $+V_B$.

In order to minimize energy consumption, transistors $T_4$ and $T_5$ are advantageously so dimensioned (as by being provided with a long and narrow channel) that their gain is very low compared with that of transistor $T_3$. The magnitude of the potential at point $a$ can then not be appreciably higher than the positive battery voltage $+V_B$ supplemented by the threshold voltage of transistor $T_3$. Since this latter threshold voltage is practically identical with that of transistor $T_1$, the source/gate voltage $V_{SG1}$ of this transistor exceeding its threshold will be substantially equal to $V_{SDL}$; this relationship is independent of the absolute value of the threshold voltage. Such an arrangement practically avoids any over-excitation of the switching transistors and the decrease in their mean gain with increasing amplitude is basically due to the reduction in phase angle $\theta$.

An oscillatory system according to my invention, especially if equipped with a quartz crystal of high natural frequency, may be used in an electronic clockwork for a wristwatch operating with very low power consumption in its energizing circuit. While the energy required for driving a quartz crystal is relatively high, the use of a crystal of small dimensions will also reduce that energy component.

In the case of a d-c/d-c converter wherein the oscillator output is rectified, a cheap resonator of, for example, ceramic material could be used. Such a converter may be supplied by miniature batteries with an operating current in the microampere range. A system of this type is particularly useful for portable minicomputers.

I claim:
1. An oscillatory system comprising:
   a piezoelectric resonator having a first and a second terminal;
   a direct-current supply having a reference pole and a working pole with potentials encompassing a predetermined voltage range;
   a first and second field-effect transistor each having a source, a drain and an insulated gate, said transistors forming a series FET pair with the drain of said first transistor connected to said working pole, the source of said second transistor connected to said reference pole and the source of said first transistor forming a junction with the drain of said second transistor;
   a capacitive voltage divider having a tap connected to said junction, said voltage divider being inserted between the gate of said first transistor and the source of said second transistor;
   a first connection extending from the gate of said first transistor to said first terminal;
   a second connection extending from the gate of said second transistor to said second terminal;
   first biasing means connected to the gate of said first transistor for supplying thereto a potential within said voltage range; and
   second biasing means connected to the gate of said second transistor for supplying thereto a potential outside said voltage range.

2. An oscillatory system as defined in claim 1 wherein said second connection includes a coupling capacitor.

3. An oscillatory system as defined in claim 2, comprising a further capacitor between the gate of said second transistor and said reference pole.

4. An oscillatory system comprising:
   a piezoelectric resonator having a first and a second pair of opposite terminals;
   a direct-current supply having a reference pole and a working pole with potentials encompassing a predetermined voltage range;
   two series FET pairs connected in parallel across said supply, each FET pair including a first and a second field-effect transistor each having a source, a drain and an insulated gate, the drain of said first transistor being connected to said working pole, the source of said second transistor being connected to said reference pole and the source of said first transistor forming a junction with the drain of said second transistor;
   a pair of capacitive voltage dividers each having a tap connected to the junction of a respective FET pair, each of said voltage dividers being inserted between the gate of the first transistor and the source of the second transistor of the respective FET pair;
   a first connection extending from the gate of the first transistor of each FET pair to a respective terminal of said resonator;
   a second connection extending from the gate of the second transistor of each FET pair to the opposite terminal of said resonator;
   first biasing means connected to the gates of the first transistor of each FET pair for supplying thereto a potential within said voltage range; and
   second biasing means connected to the gates of the second transistor of each FET pair for supplying thereto a potential outside said voltage range.

5. An oscillatory system as defined in claim 4, further comprising a ground lead capacitively coupled to said reference pole, said first and second biasing means forming part of an ancillary network inserted between said ground lead and said reference pole.

6. An oscillatory system as defined in claim 5 wherein said ancillary network consists exclusively of FETs and capacitors.

7. An oscillatory system as defined in claim 4 wherein said second connection comprises a coupling capacitor.

8. An oscillatory system as defined in claim 7, comprising a further capacitor between the gate of said second transistor of each FET pair and said reference pole.

9. An oscillatory system as defined in claim 8 wherein said second biasing means comprises additional field-effect transistors with insulated gates.

10. An oscillatory system as defined in claim 9 wherein all field-effect transistors and capacitors are part of an integrated module.

* * * * *